United States Patent [19]

Davidson

[11] Patent Number: 5,054,116

[45] Date of Patent: Oct. 1, 1991

[54] FEED-FORWARD AUTOMATIC LEVEL CONTROL CIRCUIT FOR A HIGH-FREQUENCY SOURCE

[75] Inventor: Mark N. Davidson, Santa Rosa, Calif.

[73] Assignee: Hewlett-Packard Company, Palo Alto, Calif.

[21] Appl. No.: 414,834

[22] Filed: Sep. 29, 1989

[51] Int. Cl.[5] .......................... H03C 1/06; H04B 1/04
[52] U.S. Cl. .................................... 455/126; 332/107; 332/157
[58] Field of Search ................ 455/108, 109, 116, 117, 455/126, 127; 330/279, 138; 332/125, 155, 107, 157, 162

[56] References Cited

U.S. PATENT DOCUMENTS

| | | | |
|---|---|---|---|
| 3,668,533 | 6/1972 | Fish et al. | 328/168 |
| 4,379,272 | 4/1983 | Wheatley | 332/38 |
| 4,403,255 | 9/1983 | Schiff | 358/186 |
| 4,412,337 | 10/1983 | Bickley et al. | 375/60 |

Primary Examiner—Curtis Kuntz
Assistant Examiner—Chi H. Pham
Attorney, Agent, or Firm—William C. Milks, III

[57] ABSTRACT

In a feedback loop level control circuit for an RF source, the RF output is sensed and compared to a reference level which determines the desired output power level. The difference between the output sample and the reference level constitutes an error signal which is applied to an integrator. The reference level is summed with the output of the integrator and the resulting sum is used to control a modulator which variably attenuates the RF output. When the system is operating in a pulse amplitude modulation mode, the reference level signal is modulated and compared to a threshold signal that determines the lowest output level that can be accurately sensed. If the modulated reference level is above the threshold, the feedback loop is closed, otherwise when the modulation signal reduces the output power level to a level which is too low to detect accurately, the feedback loop is opened.

20 Claims, 3 Drawing Sheets

FEED-FORWARD AUTOMATIC LEVEL CONTROL CIRCUIT FOR A HIGH-FREQUENCY SOURCE

FIELD OF THE INVENTION

This invention relates to gain control or level control circuits for radio-frequency sources.

BACKGROUND OF THE INVENTION

Frequently, it is desirable in the construction of radio-frequency (RF) devices, such as transmitters, power generators and test equipment, to utilize an RF source which generates RF power with a constant amplitude while the output frequency is swept over a predetermined frequency range. As the required range is frequently large and broadband power sources with constant output over the entire band are difficult to construct, level control or gain control circuits are necessary.

Conventional automatic level control or automatic gain control circuits operate with a feedback loop that controls a linear modulator connected in series with the RF source output. More particularly, the RF output is sampled and compared to a reference level which determines the desired output power level. The difference between the output sample and the reference level constitutes an error signal which is applied to an integrator. The output of the integrator, in turn, controls the modulator so that the operation of the feedback loop drives the error signal to zero and the result is a stable output level.

The same feedback arrangement can also be used to amplitude modulate the output of the generator by simply adding a modulating signal to the reference level. The feedback loop will then force the output amplitude to follow the modulating signal.

The conventional feedback arrangement can also be used to generate amplitude modulated pulses by inserting a pulse modulator in series with the linear modulator. With this connection the pulse modulator generates pulses and the linear modulator modulates the amplitude of the pulses. In this arrangement, however, it is necessary to place a switch in the aforementioned amplitude feedback loop so that the loop is not operational between pulses.

This prior art level control circuit functions well in most situations. However, it suffers from some serious limitations. More particularly, the percentage "depth" of the amplitude modulation (AM) is limited. More particularly, because of the feedback loop arrangement, the dynamic range of the feedback loop is limited to the dynamic range of the element which has the smallest dynamic range. For example, if the linear modulator used to control the output of the power generator has a greater usable dynamic range than the output sampling circuitry, the dynamic range of the modulator cannot be fully utilized for amplitude modulation. In a typical case, the output sampling and detection circuitry limits the usable dynamic range due to DC offset drift and noise. For example, the power available from an RF generator might be approximately +10 dBm. However, in a typical RF detector, the generator output amplitude cannot be sensed accurately below −10 dBm so that the total sensing range is approximately 20 dB. Consequently, the maximum possible AM depth would be 90%. An attempt to operate the feedback system with an AM depth greater than 90% would cause severe AM distortion even if a linear modulator with an 80 dB dynamic range is used.

A second limitation of the aforementioned prior art level control circuitry is that the AM bandwidth is limited. In accordance with conventional feedback control loop theory, loop bandwidth is limited by time delays in the loop components. In particular, in the configuration discussed, the loop integrator time constant must be made significantly longer than the total delay in the rest of the loop; otherwise, the system becomes unstable. Thus, even if the linear modulator is capable of operating over a larger AM bandwidth than the feedback loop, that bandwidth cannot be utilized due to the integrator time constant.

A third limitation is that pulse modulation with the conventional circuit is limited by bandwidth degradation. Since pulse modulation increases the length of time required for the feedback loop system to respond to changes in either the reference level or the modulation signal, the AM bandwidth is effectively reduced and, in particular, the degradation in bandwidth is proportional to the pulse duty cycle. For example, if pulse amplitude modulation is being performed with 10 microsecond wide pulses spaced 100 microseconds apart, the AM bandwidth of the modulation system is effectively reduced by a factor of 10. Accordingly, this latter problem can severely limit the speed with which pulse amplitude can be modulated.

One prior art solution to these limitations is to disconnect the aforementioned level control feedback loop whenever amplitude modulation is being carried out at high rates or at large depth. The circuit then operates in a "open loop" configuration without feedback control. Conventional linear modulators and drive circuits typically have sufficient linearity to minimize gain variations and, thus, these circuits can provide amplitude modulation with acceptable distortion even without the error correcting action of the feedback loop.

In order to operate a circuit in an "open loop" configuration, the output level must be manually set. To do this, the previously-described prior art feedback loop is closed and the RF output amplitude is set to the desired level. The loop integrator output is then measured. Subsequently, the integrator is disconnected and the modulator is driven directly with a reference signal which has been set to the measured integrator output. Any amplitude modulation signals are added to this reference signal.

In this manner, the aforementioned problems with depth and bandwidth limitations are avoided, however, the level-setting procedure must be repeated whenever the RF output frequency or amplitude must be changed. Even if the RF output frequency and amplitude do not change, the level-setting procedure must be performed periodically because temperature changes cause the gains of the RF generator and modulator to change. Similarly, with such an open loop circuit it is not possible to maintain a constant RF output amplitude while sweeping the output frequency. Finally, even though the level setting procedure can be automated, it still takes a significant amount of time to perform the procedure and it is often inconvenient to perform.

Accordingly, it is an object of the present invention to provide an automatic level control circuit in which the amplitude modulation bandwidth is expanded over prior art circuits.

It is another object of the present invention to provide an automatic level control circuit which has greater pulse amplitude modulation bandwidth.

It is still another object of the present invention to provide an automatic level control circuit which utilizes a feedback loop to automatically set the level while operating in both the AM mode and pulse amplitude modulation mode.

It is a further object of the present invention to provide an automatic level control circuit in which the feedback loop is designed so that the dynamic range of all the components in the feedback loop can be utilized and the percentage AM depth can be increased.

It is still a further object of the present invention to provide an automatic level control circuit which has low distortion at high AM depth while operating in the closed loop leveled output mode.

It is yet a further object of the present invention to provide an automatic level control circuit in which the output power level is easily set to a desired value.

SUMMARY OF THE INVENTION

The foregoing objects are achieved and the foregoing problems are solved in one illustrative embodiment of the invention in which a feedback loop stabilizes the output power level. The reference level which determines the output power level is provided not only to the feedback loop integrator input via a delay circuit, but also directly to the linear modulator circuit. When the system is operating in the pulse amplitude modulation mode, the reference level is also used to control a switch which opens the feedback loop circuit so that when the modulation signal reduces the output power level to a level which is too low to sense accurately, the feedback loop is opened. The feedback loop is closed again to restore normal feedback operation when the output power level increases to a point where it can be accurately detected.

More particularly, the RF output is sampled and compared to a reference level which determines the desired output power level. The difference between the output sample and the reference level constitutes an error signal which is applied to an integrator. The output of the integrator, in turn, controls the modulator. In accordance with the invention, the reference level is summed with the output of the loop integrator and the resulting sum is used to control the linear modulator. The reference level signal is delayed before being provided to the loop integrator to compensate for loop delays.

When the system is operating in the pulse amplitude modulation mode, the delayed reference level (which includes the modulating signal) is compared to a threshold signal that determines the lowest output level that can be accurately sensed. If the modulated reference level is above the threshold, the feedback loop is closed, otherwise when the modulation signal reduces the output power level to a level which is too low to detect accurately, the feedback loop is opened.

The inventive configuration allows linear modulation over a very wide dynamic range without requiring a corresponding wide dynamic range in the output sensing circuits. Similarly, in pulse amplitude modulation, the inventive circuit provides an AM bandwidth which is independent of pulse duty cycle because the level control bandwidth is not dependent on the feedback loop bandwidth (which degrades with low duty cycle pulse modulation). In addition, the inventive circuit provides a faster response to changes in level references than in previous architectures.

DETAILED DESCRIPTION OF THE PREFERRED EMBODIMENT

Figure 1:
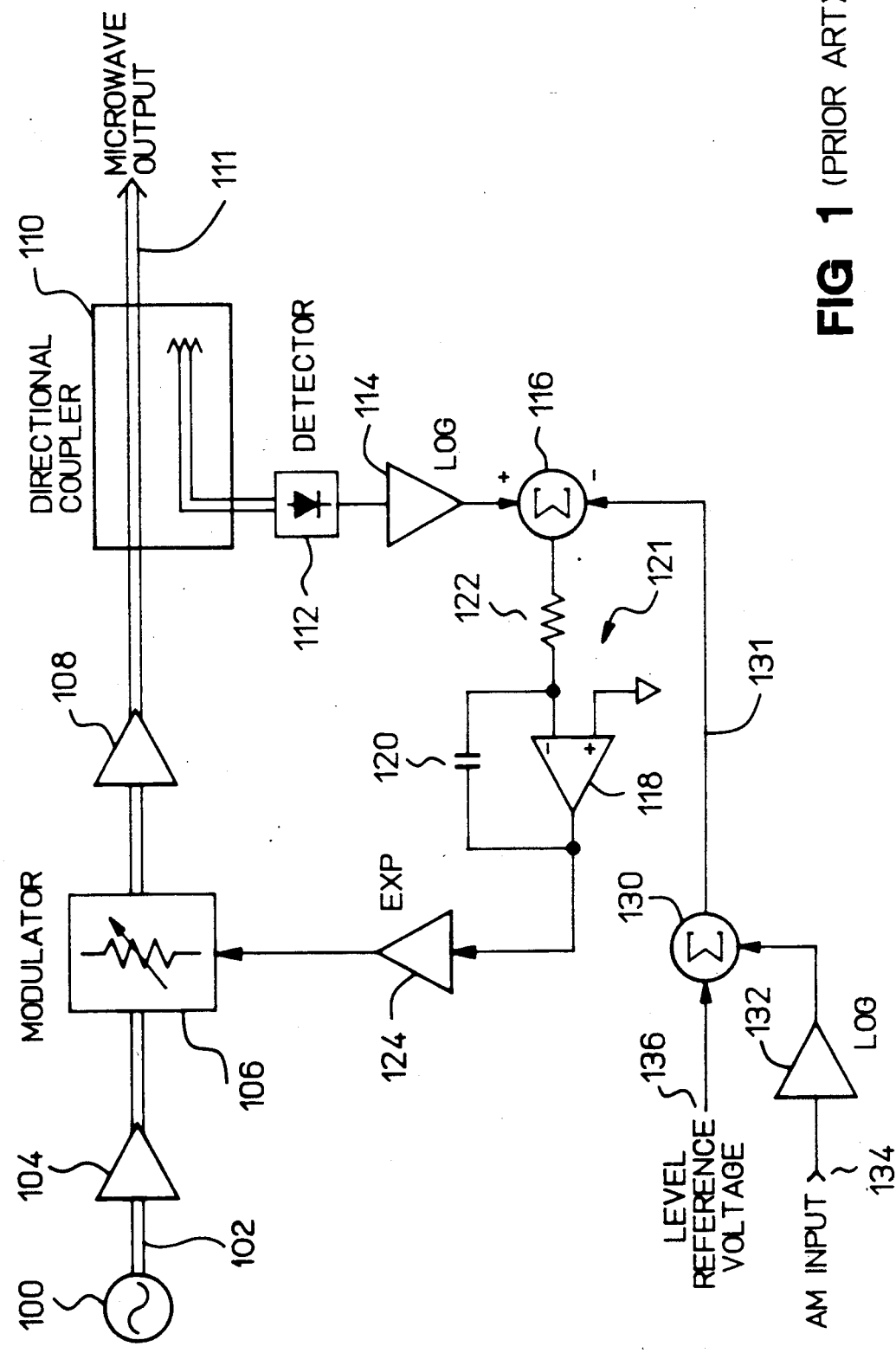
FIG. 1 is a block schematic diagram of a prior art feedback-loop automatic level control and amplitude modulation circuit.

FIG. 1 represents a typical prior art automatic level control circuit for use with RF sources. The circuit functions to produce an output 111 with a controlled amplitude. RF power is generated by a conventional generator 100 which may illustratively be an oscillator, magnetron or semiconductor oscillator. The output power from the oscillator 100 is provided via transmission line 102 which may be, for example, a microstrip line, waveguide or other transmission arrangement to power amplifier 104. If both oscillator 100 and power amplifier 104 are broadband devices, RF power can be produced over a wide range of frequencies. However, generally the output of amplifier 104 will not have constant amplitude over the entire range.

Accordingly, the output of amplifier 104 is provided to a conventional linear modulator 106. The output of modulator 106 is, in turn, provided to buffer amplifier 108, directional coupler 110 and finally to the output 111. Consequently, the output amplitude at output 111 can be controlled directly by the linear modulator 106. Modulator 106, in turn, is controlled by a feedback loop in which the major components consist of a detector 112, amplifier 114, integrator 121 and amplifier 124.

More particularly, directional coupler 110 samples a small fraction of the output power and diverts the sample to a conventional detector 112 which is shown schematically as a diode. Detector 112 converts the RF output power to a DC voltage which is provided to a buffer amplifier 114. Generally, amplifier 114 is a logarithmic amplifier or log amplifier for several reasons. Generally, a log amplifier increases the dynamic range over which the RF amplitude can be controlled and keeps the feedback loop gain constant even though the gain of the RF generator and amplifier may vary considerably with frequency. Finally, a log amplifier allows correction of any non-linearities in detector 112 by using a multiple-slope breakpoint amplifier. In addition, a log amplifier allows the reference level (described below) to be easily calibrated in decibels.

The output of amplifier 114 is provided to the positive input of summing point 116 which is associated with integrator 121. At summing point 116, the output voltage is summed with a reference level voltage provided on line 131. As will be hereinafter described, this reference voltage is used to set the output level of the circuit.

The difference between the analog output voltage produced by amplifier 114 and the reference level voltage is an error signal which is provided, via resistor 122, to integrator 121. As shown in FIG. 1, an illustrative analog integrator is a conventional operational amplifier integrator consisting of capacitor 120 and operational amplifier 118.

The integrated error signal produced at the output of integrator 121 is provided to exponential amplifier 124 which reverses the scaling effects of log amplifier 114, and the resulting output of amplifier 124 is used as a control voltage for linear modulator 106. In accordance with well-known feedback theory, during steady-state operation, the error voltage developed at summing point 116 is driven to zero by the operation of the feedback loop.

The above-described system can also be used in a straightforward manner for amplitude modulation. In particular, the reference signal on line 131 can be amplitude modulated by combining a stable level reference voltage from source 136 and amplitude-modulation signal on line 134 by means of summing point 130. Generally, it is desirable that the modulation be linear so that the envelope of the modulated RF signal at output 111 has the same shape as the modulating signal on line 134. Consequently, the modulation input on line 134 is generally processed through a logarithmic amplifier 132 before being summed with the reference level voltage at summing point 130. The action of the feedback loop described above will then force the output RF amplitude at point 111 to follow the modulating input at input 134 with reasonably good fidelity within the dynamic range and bandwidth limitations of the feedback loop. The amplitude-modulated "carrier" or base level can be set by changing the reference voltage level on line 136 in a conventional manner.

Figure 2:
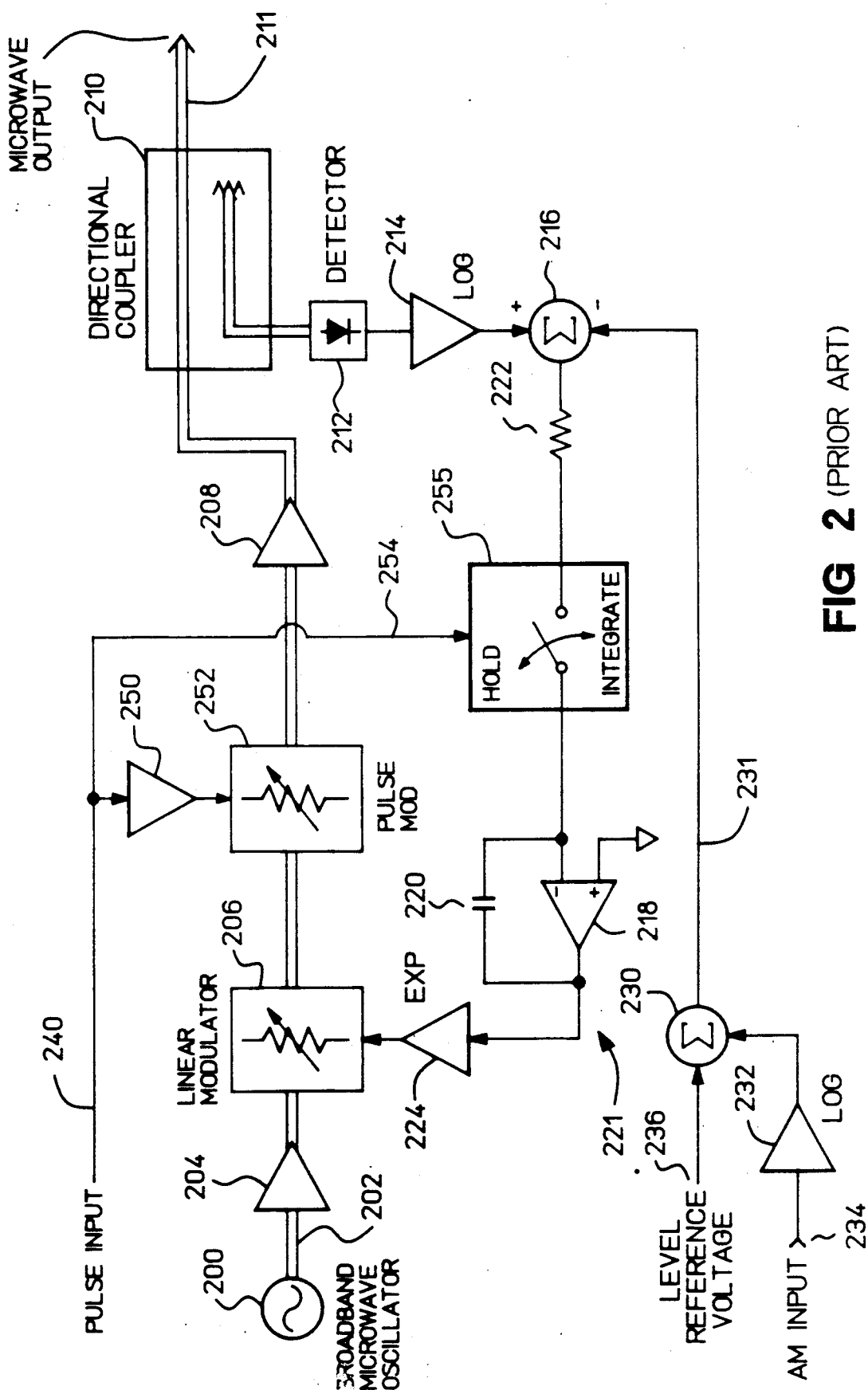
FIG. 2 of the drawing is a prior art modification of the circuit shown in FIG. 1 which allows the circuit to be used for pulse amplitude modulation.

It is also possible to use the prior art configuration for pulse amplitude modulation by modifying the circuit as shown in in FIG. 2. In FIG. 2, elements which correspond to elements in FIG. 1 have been given equivalent numeral designations. For example, RF oscillator 200 in FIG. 2 corresponds to RF oscillator 100 in FIG. 1. Similarly, amplifier 204 corresponds to amplifier 104, etc. A comparison of FIGS. 2 and 1 indicates that three additional elements have been added to the circuit to allow for pulse amplitude modulation; these elements are driver amplifier 250, pulse modulator 252 and integrate-and-hold switch 255. Pulse modulator 252 and its driver amplifier 250 are designed to provide very fast transitions between zero attenuation and very high attenuation. They are controlled by a pulse signal on input line 240 and provide the capability of turning the RF output on and off to generate pulses typically under control of standard digital logic "high" and "low" voltage levels.

In addition, the pulse control logic levels are provided, via lead 254, to integrate-and-hold switch 255. Integrate-and-hold switch 255 is arranged so that during a pulse, when the RF output is "on," the switch in element 255, (shown schematically) is closed so an error signal from summing point 216 is provided, via resistor 222, to the input of integrator 221 to "close" the feedback loop. Thus, during a pulse, the feedback loop operates to control the RF output amplitude in the manner previously described.

However, during RF "off" periods (between pulses) switch 255 opens in response to the pulse control signal and "holds" the integrator output at a constant level. Thus, the integrator output remains constant while the RF output is interrupted by pulse modulator 252. This operation allows the automatic loop control circuit to control the RF output amplitude without disruption.

Figure 3:
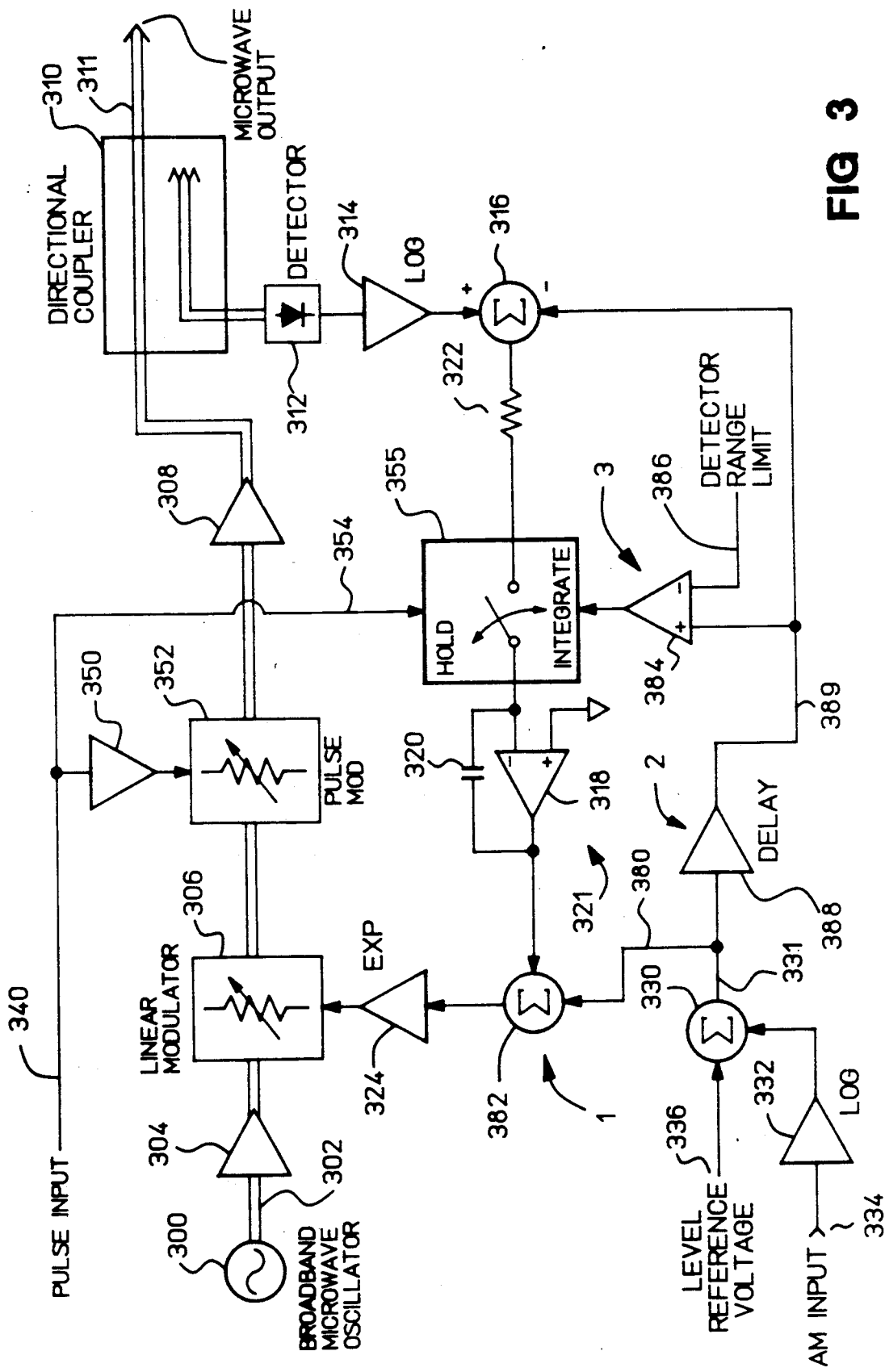
FIG. 3 of the diagram is a block schematic diagram of the inventive feed-forward automatic level control circuit.

However, as previously discussed the circuits shown in FIGS. 1 and 2 suffer from dynamic range and bandwidth limitations. An illustrative automatic level control circuit constructed in accordance with the invention and capable of pulse amplitude modulation is shown in FIG. 3. In FIG. 3, as with FIGS. 1 and 2, elements corresponding to those in FIGS. 1 and 2 have been given corresponding designations. For example, oscillator 300 corresponds to oscillators 100 and 200 in FIGS. 1 and 2, respectively. A comparison of FIG. 3 with FIG. 2 indicates that several new components have been added in order to significantly improve the dynamic performance of the circuit.

In particular, the amplitude modulated reference level, which appears on lead 331 from summing point 330 is now provided to an additional summing point 382, via lead 380. At summing point 382, the amplitude modulated reference level is directly summed with the output of integrator 321. Thus, the modulated reference level is fed "forward" directly to the linear modulator. In addition, the amplitude modulated reference level on lead 331 is provided by delay circuit 388 to summing point 316 which drives integrator 321 and to the positive input of comparator 384.

In accordance with the invention, since the amplitude modulated reference level is directly provided to linear modulator 306, the modulator can be directly driven by the modulating signal and a wide AM bandwidth can be achieved in the circuit without requiring a corresponding bandwidth in the feedback loop. Consequently, a relatively low bandwidth feedback loop can be used to provide accurate drift-free control of the absolute output power level or the amplitude modulated "carrier" level.

Delay circuit 388 compensates for delays in the modulator and detector portions of the loop. Without such a circuit, an unwanted error signal appears at the loop summing node 316 at increasing AM rates causing an unwanted peak in the AM frequency response.

Detection range limit comparator 384 compares the delayed modulating signal with a predetermined threshold signal on line 386 which signal is indicative of the lowest magnitude output signal which can be accurately sensed by detector 312. The threshold signal on line 386 can be determined experimentally or by calculations and is dependent on the precise configuration of coupler 310, detector 312 and amplifier 314. Comparator 384 controls integrate-and-hold switch 355 in such a way that the feedback loop is opened and level control information in the loop integrator is held or "remembered" when the modulated output power (as represented by the reference level signal) drops to a level too low for coupler 310, detector 312 and amplifier 314 to measure accurately. Comparator 384 closes the feedback loop to restore normal feedback loop operation when the modulated output power returns to levels which can be accurately sensed by coupler 310, detector 312 and amplifier 314. Comparator 384 allows for linear modulation over a very wide dynamic range without requiring correspondingly wide dynamic range in the detector and its associated circuits.

Although only one embodiment of the invention is disclosed herein, modifications and changes will be readily apparent to those skilled in the art, which modifications and enhancements are within the spirit and scope of the invention and intended to be covered by the claims set forth below.

What is claimed is:

1. In an automatic level control circuit for controlling the output power amplitude of an RF source in accordance with a reference level signal, said control circuit having means for modulating the output of said RF source and a feedback loop circuit responsive to said reference level signal and to said output power amplitude for generating an amplitude control signal for controlling said modulating means so that said output power amplitude is related to said reference level signal, the improvement comprising:
   means for combining said reference level signal with said amplitude control signal so that said modulating means is controlled by a combination of said reference level signal and said amplitude control signal.

2. In an automatic level control circuit for controlling the output power amplitude of an RF source, the improvement according to claim 1 further comprising means for time delaying said reference level signal so that said feedback loop circuit is responsive to a time-delayed reference level signal instead of said reference level signal.

3. In an automatic level control circuit for controlling the output power amplitude of an RF source, the improvement according to claim 2 further comprising means responsive to said time-delayed reference level signal for disconnecting said feedback loop circuit from said modulating means when said time-delayed reference level signal falls below a predetermined threshold level.

4. In an automatic level control circuit for controlling the output power amplitude of an RF source, the improvement according to claim 1 further comprising means responsive to said reference level signal for disconnecting said feedback loop circuit from said modulating means when said reference level signal falls below a predetermined threshold level.

5. In an automatic level control circuit for controlling the output power amplitude of an RF source, the improvement according to claim 4 wherein said feedback loop circuit comprises a detector for sampling said RF source output power amplitude, said detector being operable over a range of RF source output power amplitudes and said predetermined threshold level is determined from the lowest RF source output power amplitude with which said detector is operable.

6. In an automatic level control circuit for controlling the output power amplitude of an RF source in accordance with a reference level signal, said control circuit having means for modulating the output of said RF source, means responsive to said RF source output power amplitude for generating an amplitude signal, means responsive to said amplitude signal and to said reference level signal for generating an error signal representing the difference between said amplitude signal and said reference level signal, an integrator responsive to said error signal for generating an amplitude control signal for controlling said modulating means so that said output power amplitude is related to said reference level signal, the improvement comprising:
   means for summing said reference level signal with said amplitude control signal so that said modulating means is controlled by the sum of said reference level signal and said amplitude control signal.

7. In an automatic level control circuit for controlling the output power amplitude of an RF source, the improvement according to claim 6 further comprising means for time delaying said reference level signal so that said error signal generating means is responsive to a time-delayed reference level signal instead of said reference level signal.

8. In an automatic level control circuit for controlling the output power amplitude of an RF source, the improvement according to claim 7 further comprising means responsive to said time-delayed reference level signal for disconnecting said feedback loop circuit from said modulating means when said time-delayed reference level signal falls below a predetermined threshold level.

9. In an automatic level control circuit for controlling the output power amplitude of an RF source, the improvement according to claim 8 wherein said amplitude signal generating means comprises a detector for sampling said RF source output power amplitude, said detector being operable over a range of RF source output power amplitudes and said predetermined threshold level is determined from the lowest RF source output power amplitude with which said detector is operable.

10. In an automatic level control circuit for controlling the output power amplitude of an RF source, the improvement according to claim 6 further comprising a pulse modulator external to said automatic level control circuit and connected in series with said modulating means, said pulse modulator being responsive to a pulse control signal and to said RF source output power for forming said RF source output power into output pulses and means responsive to said pulse control signal for disconnecting said feedback loop circuit at times between output pulses.

11. An automatic level control circuit for controlling the output power amplitude of an RF source in accordance with a reference level signal, said control circuit comprising:
   means for modulating the output of said RF source;
   means responsive to said RF source output power amplitude for generating an amplitude signal;
   means for time delaying said reference level signal;
   means responsive to said amplitude signal and to a time-delayed reference level signal for generating an error signal representing the difference between said amplitude signal and said reference level signal;
   an integrator responsive to said error signal for generating an amplitude control signal;
   means for summing said reference level signal with said amplitude control signal so that said modulating means is controlled by the sum of said reference level signal and said amplitude control signal; and
   means responsive to said amplitude control signal for controlling said modulating means so that said output power amplitude is related to said reference level signal.

12. An automatic level control circuit for controlling the output power amplitude of an RF source according to claim 11 further comprising a pulse modulator external to said automatic level control circuit and connected in series with said modulating means, said pulse modulator being responsive to a pulse control signal and to said RF source output power for forming said RF source output power into output pulses and means responsive to said pulse control signal for disconnecting said feedback loop circuit at times between output pulses.

13. An automatic level control circuit for controlling the output power amplitude of an RF source according to claim 12 further comprising means responsive to said time-delayed reference level signal for disconnecting said integrator from said error signal generating means when said time-delayed reference level signal falls below a predetermined threshold level.

14. An automatic level control circuit for controlling the output power amplitude of an RF source according to claim 13 wherein said amplitude signal generating means comprises a detector for sampling said RF source output power amplitude, said detector being operable over a range of RF source output power amplitudes and said predetermined threshold level is determined from the lowest RF source output power amplitude with which said detector is operable.

15. A method for controlling the output power amplitude of an RF source in accordance with a reference level signal comprising the steps of:
   A. sensing an output power amplitude;
   B. generating an amplitude control signal from the sensed output power amplitude and said reference signal;
   C. generating a modulation signal by combining said reference level signal with said amplitude control signal; and
   D. modulating the output of said RF source in accordance with said modulation signal generated in step C.

16. A method for controlling the output power amplitude of an RF source according to claim 15 wherein step B comprises the steps of:
   B1. summing said sensed output power amplitude and said reference signal to generate an error signal; and
   B2. integrating said error signal to generate said amplitude control signal.

17. A method for controlling the output power amplitude of an RF source according to claim 15 wherein step C comprises the step of:
   C1. summing said amplitude control signal with said reference signal.

18. A method for pulse modulating the output of an RF source in accordance with a reference level signal and a pulse control signal, said method comprising the steps of:
   A. sensing an output power amplitude;
   B. generating an amplitude control signal from the sensed output power amplitude and said reference signal;
   C. generating a modulation signal by combining said reference level signal with said amplitude control signal; and
   D. linearly modulating the output of said RF source in accordance with said modulation signal generated in step C;
   E. pulse modulating the linearly modulated output obtained in step D in accordance with said pulse control signal; and
   F. holding said amplitude control signal when the output power amplitude of said RF source is reduced to such a lower value so that it cannot be sensed in step A.

19. A method for controlling the output power amplitude of an RF source according to claim 18 wherein step B comprises the steps of:
   B1. summing said sensed output power amplitude and said reference signal to generate an error signal; and
   B2. integrating said error signal to generate said amplitude control signal.

20. A method for controlling the output power amplitude of an RF source according to claim 19 wherein step C comprises the step of:
   C1. summing said amplitude control signal with said reference signal.

* * * * *